United States Patent
Chen et al.

(10) Patent No.: US 7,092,250 B2
(45) Date of Patent: Aug. 15, 2006

(54) VIBRATION-PROOF REMOVABLE MODULE

(75) Inventors: Chao-Jung Chen, Taipei (TW); Jen-Hsiang Lee, Taipei (TW); Yuan-Chen Liang, Tao Yuan Shien (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 0 days.

(21) Appl. No.: 11/025,073

(22) Filed: Dec. 30, 2004

(65) Prior Publication Data

US 2005/0174730 A1    Aug. 11, 2005

(30) Foreign Application Priority Data

Feb. 5, 2004    (TW) .............................. 93201613 U

(51) Int. Cl.
*H05K 5/00*    (2006.01)
*H05K 7/00*    (2006.01)
*G06F 1/16*    (2006.01)

(52) U.S. Cl. ...................... 361/685; 361/683; 361/684; 361/825; 361/686

(58) Field of Classification Search ................ 361/825, 361/683, 684–686, 690, 695
See application file for complete search history.

(56) References Cited

U.S. PATENT DOCUMENTS

| 6,166,900 | A * | 12/2000 | Flynn et al. ................. 361/685 |
| 6,421,236 | B1 * | 7/2002 | Montoya et al. ............. 361/685 |
| 6,735,093 | B1 * | 5/2004 | Mu-Tsai ...................... 361/818 |
| 6,798,650 | B1 * | 9/2004 | Reznikov et al. ........... 361/685 |
| 6,882,526 | B1 * | 4/2005 | Neukam et al. ............. 361/685 |
| 2003/0011974 | A1 * | 1/2003 | Curlee et al. ................ 361/683 |
| 2005/0013108 | A1 * | 1/2005 | Lee ............................. 361/685 |
| 2005/0073809 | A1 * | 4/2005 | Chang ......................... 361/684 |

* cited by examiner

*Primary Examiner*—Randy W. Gibson
*Assistant Examiner*—Hoa C. Nguyen
(74) *Attorney, Agent, or Firm*—Rabin & Berdo, PC

(57) ABSTRACT

A vibration-proof removable module is described. The vibration-proof removable module includes a chassis and sidewalls. The chassis further has a vibration-proof space to avoid interference between the chassis and an electrical device fixed within the vibration-proof removable module. The sidewall further has a sliding vibration absorption device to isolate the vibration-proof removable module from the vibration force and shock force of an outside environment. The sliding vibration absorption device has a vibration absorption slider and the vibration absorption slider further has leaf springs thereon. Furthermore, the sliding vibration absorption device has a vibration absorption pad therein to improve a vibration absorption effect.

9 Claims, 2 Drawing Sheets

VIBRATION-PROOF REMOVABLE MODULE

RELATED APPLICATIONS

The present application is based on, and claims priority from, Taiwan Application Serial Number 93201613, filed Feb. 5, 2004, the disclosure of which is hereby incorporated by reference herein in its entirety.

FIELD OF THE INVENTION

The present invention relates to a vibration-proof removable module, and more particularly, to a lightweight vibration-proof removable module for server racks.

BACKGROUND OF THE INVENTION

Information technology and the computer industry are highly developed now. People rely heavily on computer systems. Therefore, computer servers with high calculation capacity and high stability are important for computer systems. Due to increasingly reduced office space, area occupied by computer servers must also be reduced. Computer servers must maintain a high degree of stability to serve users, and the space occupied by one computer server is usually greater than or equal to that of a desktop computer. Accordingly, the management of computer servers is difficult and space utilization is tightened. Typical companies have 2 or 3 computer servers while others may have more than a thousand computer servers. Computer server management and space utilization become more critical in companies with more computer servers.

A 1U computer server mounted on a standard 1U server rack is the mainstream computer server arrangement. Each standard layer of the rack is about 1.75 inches (about 4.5 centimeters), so that the 1U computer server and the rack effectively conserve space of the computer servers. Moreover, the 1U servers and racks are more efficiently controlled because the 1U servers and racks can be centrally managed and easily stacked. Normally, hardware used in the 1U server is provided with a smaller size and lower height to fit the thickness limitation of 1.75 inches.

A server system is convenient to a user for seeking or storing data because the server rack usually provides numerous hard disks to store data therein. The hard disks on the server racks are especially convenient for data exchange, repair and installation because each hard disk is installed in a removable module and the removable module is installed in the server rack.

The dimensions of the server rack and the dimension of the removable module limit the quantity of conventional removable hard disk modules which can be installed in one server rack. That is to say, due to the width and height limitations, some residual space of the server rack cannot be utilized for hard disk installation. Therefore, various hard disk removable modules are manufactured to effectively utilize the limited space in the server racks. However, due to effective utilization of the limited space in the rack, the space designed between the hard disk and the removable module is constantly being compressed. Accordingly, a vibration-proof mechanism between the hard disk and the removable module is more difficult to design.

SUMMARY OF THE INVENTION

It is an objective of the present invention to provide a removable module with a vibration-proof space on a bottom thereof to eliminate vibration interference between the removable module and an electrical device installed therein so as to form a lightweight removable module to reduce the total weight of the removable module.

It is another objective of the present invention to provide a vibration-proof removable module with a vibration absorption mechanism on a sidewall thereof to improve the reliability and life span of the vibration-proof removable module and a electrical device installed therein.

To accomplish the above objectives, the present invention provides a vibration-proof removable module. The vibration-proof removable module has at least one tray sidewall and a tray chassis. The tray chassis is coupled to one side of the tray sidewall and the tray chassis has a vibration-proof space to reduce a weight of the vibration-proof removable module and avoid contact between the tray chassis and an electrical device installed in the vibration-proof removable module. The vibration-proof space is formed by an opening on the tray chassis.

The tray sidewall further has at least one sliding vibration absorption device to isolate the vibration-proof removable module from outside vibration and shock forces. The sliding vibration absorption device has a vibration absorption slider and the vibration absorption slider further has at least one leaf spring to further increase the sliding and vibration absorption capabilities of the vibration-proof removable module.

The sliding vibration absorption device further has a vibration absorption pad, e.g. a vibration absorbing rubber, installed inside of the vibration absorption slider and adjacent to the tray sidewall to absorb the vibration force and the shock force. The vibration absorption pad further has at least one vibration absorption protrusion portion corresponding to the leaf spring of the vibration absorption slider. The tray sidewall further has at least one knob corresponding to at least one fixing hole of the vibration absorption slider for fixing the vibration absorption slider on the tray sidewall. The front portion of the vibration-proof removable module further has a withdrawal handle convenient for installation and removal the vibration-proof removable module. The vibration-proof removable module preferably applies to fix an electrical device on a server rack so that the electrical device is able to be conveniently installed on and removed from the rack. When the vibration-proof removable module is installed on a 1U server rack, the space in the server rack can be effectively utilized and the electrical device installed in the vibration-proof removable module can be protected from outside vibration force and shock force so as to increase the reliability and life span of the electrical device.

Hence, the vibration-proof removable module can effectively reduce space waste in the server rack and further provide enough protection for the electrical device therein. Therefore, the reliability and life span of the electrical device can be enhanced. Furthermore, the data storage capability of the server with the vibration-proof removable module can be efficiently increased under an improved removal and installation speed.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
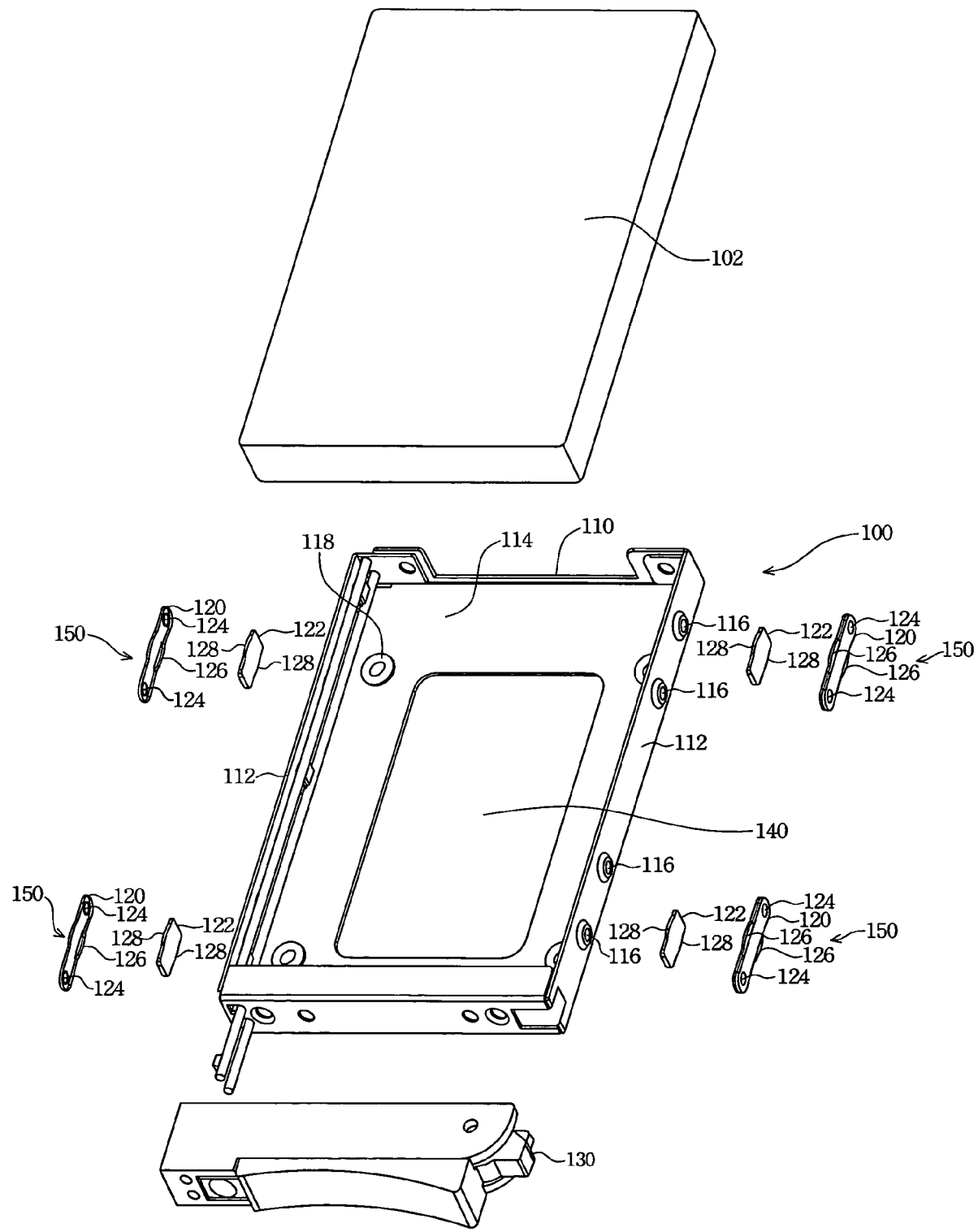
FIG. 1 is a preferred embodiment of the vibration-proof removable module according to the present invention.
Figure 2:
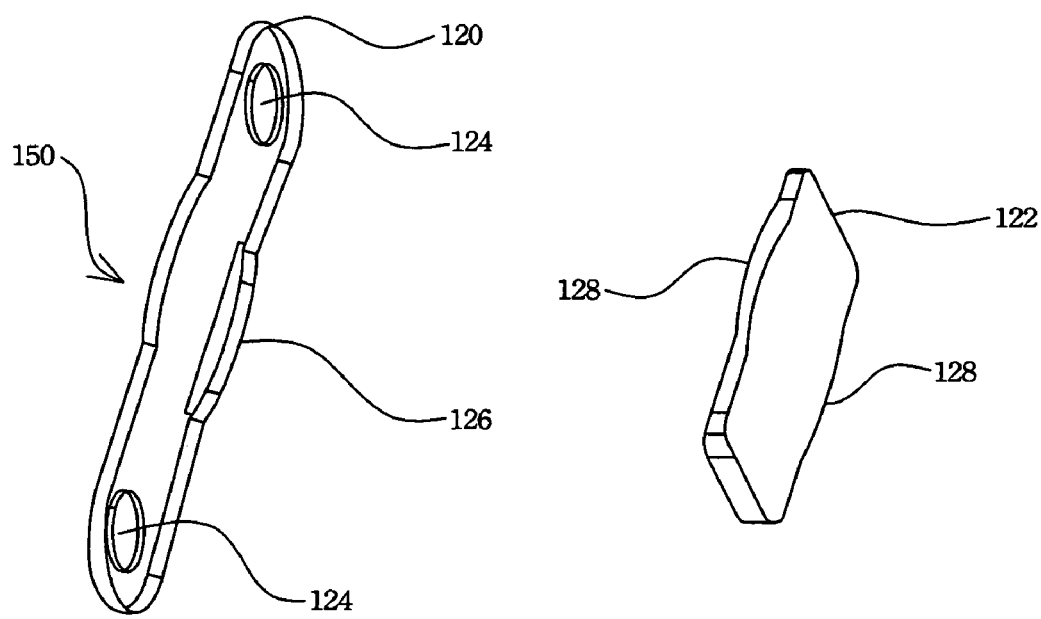
FIG. 2 is a partial enlarged view of the preferred embodiment of the vibration-proof removable module according to the present invention.

FIG. 1 is a preferred embodiment of the vibration-proof removable module according to the present invention. The vibration-proof removable module 100 includes a device tray 110 constructed of a tray chassis 114 and tray sidewalls 112. The device tray 110 is utilized to easily receive and interchange an electrical device 102, such as a hard disk, an optical disk driver, or a floppy. The vibration-proof removable module 100 can effectively utilize the limited space of a server rack to improve a utility rate of the limited space of the server rack.

Due to the tray sidewall 112 having a sliding vibration absorption device 150, the vibration-proof removable module 100 is able to be installed in and removed from the server rack easily. The sliding vibration absorption device 150 has a vibration absorption slider 120 with a slim flat shape and with fixing holes 124 and leaf springs 126 thereon. The leaf springs 126 not only provide a small contact area for the vibration-proof removable module 100 sliding on the server rack to reduce the friction force between but also isolate the vibration-proof removable module 100 from the server rack.

The sliding vibration absorption device 150 further has a vibration absorption pad 122 installed in the vibration absorption slider 120 and adjacent to the tray sidewall 112. That is, the vibration absorption pad 122 is installed between the vibration absorption slider 120 and the tray sidewall 112. The vibration absorption pad 122 further has vibration absorption protrusions 128 corresponding to positions of the leaf springs 126 of the vibration absorption slider 120. When the leaf spring 126 is under a vibration force or a shock force, the leaf spring 126 deforms and the vibration absorption protrusions 128 can further absorb the vibration and shock forces so as to reduce the vibration and shock forces acting on the electrical device installed in the vibration-proof removable module 100. In the meantime, the vibration caused by the electrical device operation is also isolated from the server rack by the sliding vibration absorption device 150 to reduce influence on other equipment.

The vibration absorption pad 122 is preferably made of a buffer material with shock force absorption capability, for example a vibration absorbing rubber, to reduce the effect of shock force and increase the life span of the vibration-proof removable module 100 and the electrical device therein. The tray chassis 114 has a plurality of spacers 118 to support the electrical device. The tray chassis 114 further has a vibration-proof space 140 forming an opening on the tray chassis 114 to avoid contact between the tray chassis 114 and the electrical device. The vibration-proof space 140 can eliminate interference between the tray chassis 114 and the electrical device caused by the tray chassis 114 impacting the electrical device and therefore can reduce noise so as to improve operation quality and stability thereof. Meanwhile, the vibration-proof removable module 100, proven by a finite element method analysis and environment tests, can effectively improve the vibration-proof effect of the vibration-proof removable module 100 and reduce a total weight of the vibration-proof removable module 100 to form a lightweight vibration-proof removable module.

The tray sidewall 112 further has knob 116 for coupling to the vibration absorption slider 120. The fixing holes 124 on the vibration absorption slider 120 correspond to the knobs 116 for fixing the vibration absorption slider 120 on the tray sidewall 112 and fixing the vibration absorption pad 122 in the vibration absorption slider 120.

The vibration-proof removable module 100 further has a withdrawal handle 130 at a front portion thereof convenient to installation and removal of the vibration-proof removable module 100.

The vibration-proof removable module 100 effectively uses limited space between the electrical device and the vibration-proof removable module 100 for quick installation and removal the electrical device. When the vibration-proof removable module 100 is utilized in the server rack, the vibration-proof removable module 100 can fully utilize a width limitation in the server rack. The vibration-proof space 140 can effectively eliminate contact between the tray chassis 114 and the electrical device installed therein to avoid vibration force and shock force acting on the electrical device. The sliding vibration absorption device can further isolate the vibration-proof removable module 100 from outside vibration force and shock force so as to enhance reliability and stability of installed products.

The vibration-proof removable module utilizes vibration absorption sliding devices with capabilities of elasticity and shock absorption on at least one sidewall of the vibration-proof removable module to provide a supporting force and a buffer force for the vibration-proof removable module. Further, the sliding devices and corresponding rails both have slim dimensions so as to increase the installable quantities of removable modules and hard disks in the server rack. Therefore, the server with the vibration-proof removable module according to the present invention can provide more data storage volume and also a quick withdrawal functionality to enhance the speed of the installation, removal, and exchange of hard disks. Hence, the vibration-proof removable module according to the present invention can enhance server management efficiency. Furthermore, the vibration-proof removable module according to the present invention utilizes the vibration-proof space on the tray chassis to avoid interference between the tray chassis and the electrical device therein.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A vibration-proof removable module for fixing an electrical device therein the vibration-proof removable module comprising:

at least one tray sidewall;

a tray chassis coupled to one side of the tray sidewall, wherein the tray chassis further comprises a vibration-proof space to reduce a weight of the vibration-proof removable module and avoid contact between the tray chassis and the electrical device; and a sliding vibration absorption device coupled to the tray sidewall to isolate the vibration-proof removable module from outside vibration force and shock force, wherein the sliding vibration absorption device further comprises a vibration absorption pad and a vibration absorption slider with at least one leaf spring disposed on at least one of two opposite sides of the vibration absorption slider, the vibration absorption pad is installed inside of the vibration absorption slider and adjacent to the tray sidewall, and the vibration absorption pad further comprises at least one vibration absorption protrusion corresponding to the leaf spring of the vibration absorption slider to absorb vibration force and shock force from the leaf spring.

2. The vibration-proof removable module of claim 1, wherein the vibration-proof space is formed by an opening on the tray chassis.

3. The vibration-proof removable module of claim 1, wherein the vibration absorption pad is made of a vibration absorbing rubber.

4. The vibration-proof removable module of claim 1, wherein the tray sidewall further comprises at least one knob corresponding to at least one fixing hole of the vibration absorption slider for fixing the vibration absorption slider on the tray sidewall.

5. The vibration-proof removable module of claim 1, wherein a front portion of the vibration-proof removable module further comprises a withdrawal handle convenient for installation and removal the vibration-proof removable module.

6. A vibration-proof removable module for fixing an electrical device and convenient for removal and installation of the electrical device on a server rack, the vibration-proof removable module comprising:

at least one tray sidewall;

a tray chassis coupled to one side of the tray sidewall, wherein the tray chassis further comprises a vibration-proof space to reduce a weight of the vibration-proof removable module and avoid contact between the tray chassis and the electrical device; and at least one sliding vibration absorption device coupled to the tray sidewall and sliding on the server rack to isolate vibration force and shock force between the vibration-proof removable module and the server rack, wherein the sliding vibration absorption device further comprises;

a vibration absorption slider;

at least one leaf spring coupled to the vibration absorption slider to increase sliding and vibration absorption capabilities for the vibration-proof removable module; and a vibration absorption pad installed inside of the vibration absorption slider and adjacent to the tray sidewall to absorb the vibration force and the shock force, wherein the vibration absorption pad further comprises at least one vibration absorption protrusion corresponding to the leaf spring to absorb vibration force and shock force from the leaf spring.

7. The vibration-proof removable module of claim 6, wherein the vibration absorption pad is made of a vibration absorbing rubber.

8. The vibration-proof removable module of claim 6, wherein the tray sidewall further comprises at least one knob corresponding to at least one fixing hole of the vibration absorption slider for fixing the vibration absorption slider on the tray sidewall.

9. The vibration-proof removable module of claim 6, wherein a front portion of the vibration-proof removable module further comprises a withdrawal handle convenient for installation and removal the vibration-proof removable module.

* * * * *